(12) United States Patent
Tsutsumi et al.

(10) Patent No.: US 9,105,462 B2
(45) Date of Patent: Aug. 11, 2015

(54) SEMICONDUCTOR APPARATUS

(71) Applicant: KABUSHIKI KAISHA TOSHIBA, Minato-ku, Tokyo (JP)

(72) Inventors: Yukako Tsutsumi, Kawasaki (JP); Hidenori Okuni, Yokohama (JP); Koji Akita, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/092,509

(22) Filed: Nov. 27, 2013

(65) Prior Publication Data

US 2014/0246787 A1 Sep. 4, 2014

(30) Foreign Application Priority Data

Mar. 1, 2013 (JP) .................................. 2013-040965

(51) Int. Cl.
*H01L 25/00* (2006.01)
(52) U.S. Cl.
CPC ....... *H01L 25/00* (2013.01); *H01L 2224/48137* (2013.01); *H01L 2224/49175* (2013.01); *H01L 2924/15311* (2013.01)
(58) Field of Classification Search
CPC .......... H01L 2224/49175; H01L 2224/48137; H01L 2924/15311
See application file for complete search history.

(56) References Cited

U.S. PATENT DOCUMENTS

| 5,627,792 A | 5/1997 | Tsujimoto |
| 2004/0145042 A1 | 7/2004 | Morita et al. |
| 2005/0212853 A1* | 9/2005 | Eguchi et al. .................... 347/40 |
| 2006/0012022 A1* | 1/2006 | Ararao et al. .................. 257/689 |
| 2006/0244130 A1 | 11/2006 | Yeh |
| 2007/0052079 A1* | 3/2007 | Tsai et al. ....................... 257/685 |
| 2008/0211110 A1* | 9/2008 | Otsuka et al. ................. 257/777 |
| 2011/0012250 A1* | 1/2011 | Matsumura .................... 257/690 |
| 2011/0109000 A1* | 5/2011 | Kim et al. ....................... 257/787 |

FOREIGN PATENT DOCUMENTS

| JP | 08125143 A | 5/1996 |
| JP | 09252081 A | 9/1997 |
| JP | 2002-343930 A | 11/2002 |

(Continued)

OTHER PUBLICATIONS

Okuni, et al., "Semiconductor Device, Wireless Device, and Storage Device", Related U.S. Appl. No. 14/185,778, filed Feb. 20, 2014.

*Primary Examiner* — A. Sefer
(74) *Attorney, Agent, or Firm* — Holtz, Holtz, Goodman & Chick PC

(57) ABSTRACT

According to one embodiment, a semiconductor apparatus includes a substrate, a first semiconductor chip, a second semiconductor chip and a first converter. The first semiconductor chip includes a first surface and a second surface and is mounted on the substrate, the first surface is opposed to the substrate, the second surface is opposed to the first surface. The second semiconductor chip includes a first area and is stacked on the second surface. The first converter is arranged in the first area, the first converter is configured to perform at least one of analog-to-digital conversion and digital-to-analog conversion and arranged in the first area. A part of the first area does not overlap the first semiconductor chip when viewed from a direction perpendicular to the second surface.

9 Claims, 14 Drawing Sheets

(56) References Cited

FOREIGN PATENT DOCUMENTS

| | | |
|---|---|---|
| JP | 2004221215 A | 8/2004 |
| JP | 2006-73625 A | 3/2006 |
| JP | 2008-211188 A | 9/2008 |
| JP | 2009-054850 A | 3/2009 |
| JP | 2011155208 A | 8/2011 |
| JP | 2012080145 A | 4/2012 |
| JP | 4940064 B2 | 5/2012 |
| WO | WO 2008/084841 A1 | 7/2008 |

* cited by examiner

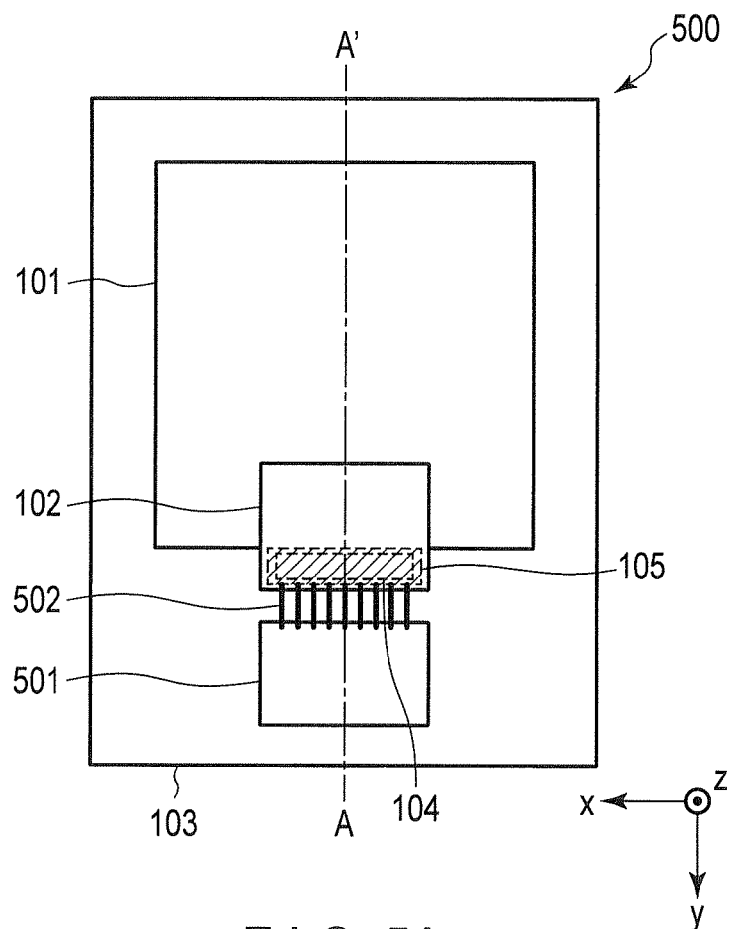
F I G. 5A
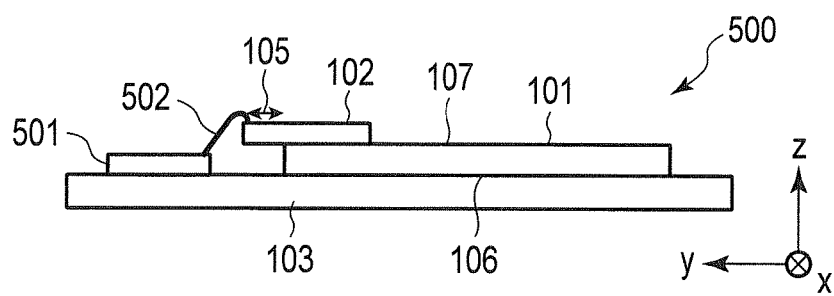
F I G. 5B

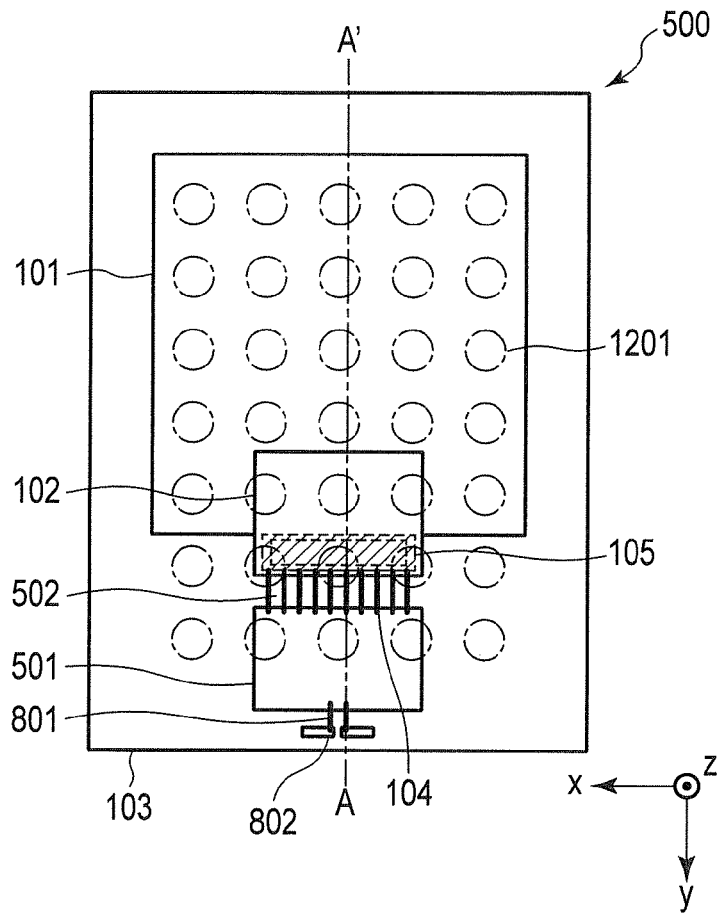
F I G. 12A
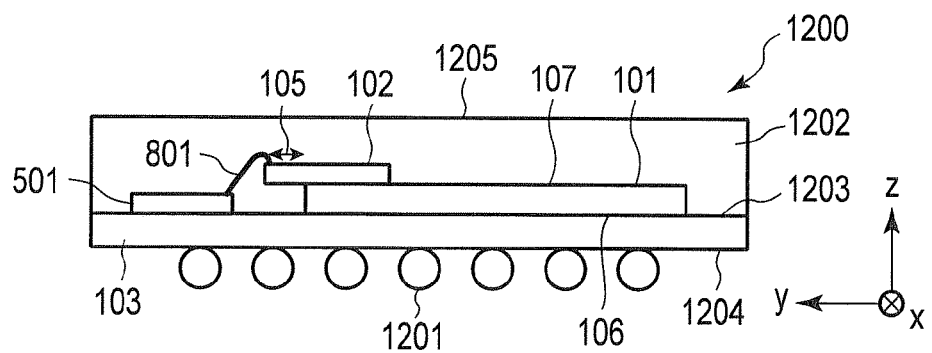
F I G. 12B

US 9,105,462 B2

SEMICONDUCTOR APPARATUS

CROSS-REFERENCE TO RELATED APPLICATIONS

This application is based upon and claims the benefit of priority from Japanese Patent Application No. 2013-040965, filed Mar. 1, 2013, the entire contents of which are incorporated herein by reference.

FIELD

Embodiments described herein relate generally to a semiconductor apparatus.

BACKGROUND

When a plurality of semiconductor elements (chips) are to be stacked, flip-chip bonding is often used. As a device in which an adverse influence of noise between semiconductor chips is reduced, the following semiconductor is proposed. When using flip-chip bonding, a wiring layer included in a flat solid layer formed of a conductive material is arranged between each of the semiconductor chips. By connecting the wiring layer to a ground terminal or a power supply terminal of the semiconductor chip, high-speed transmission can be achieved without causing adverse influence of crosstalk noise between the semiconductor chips.

BRIEF DESCRIPTION OF THE DRAWINGS

FIG. 5A is a view illustrating a semiconductor apparatus according to a fourth embodiment.

FIG. 5B is a sectional view illustrating the semiconductor apparatus according to the fourth embodiment.

FIG. 12A is a view illustrating a semiconductor apparatus according to a seventh embodiment.

FIG. 12B is a sectional view of the semiconductor apparatus according to the seventh embodiment.

DETAILED DESCRIPTION

In this technique, a wiring layer included in a flat solid layer is provided between each of the stacked semiconductor chips, and hence in the lower semiconductor chip of the plurality of stacked semiconductor chips, the rewiring layer needs to have a two-layer structure, thereby causing a problem that the semiconductor manufacturing process becomes complicated.

In general, according to one embodiment, a semiconductor apparatus includes a substrate, a first semiconductor chip, a second semiconductor chip and a first converter. The first semiconductor chip includes a first surface and a second surface and is mounted on the substrate, the first surface is opposed to the substrate, the second surface is opposed to the first surface. The second semiconductor chip includes a first area and is stacked on the second surface. The first converter is arranged in the first area, the first converter is configured to perform at least one of analog-to-digital conversion and digital-to-analog conversion and arranged in the first area. A part of the first area does not overlap the first semiconductor chip when viewed from a direction perpendicular to the second surface.

Hereinafter, a semiconductor apparatus according to each embodiment of this disclosure will be described in detail with reference to the drawings. It should be noted that in the following embodiments, duplicate descriptions are omitted assuming that parts denoted by identical reference symbols perform identical operations.

First Embodiment

Figure 1A:
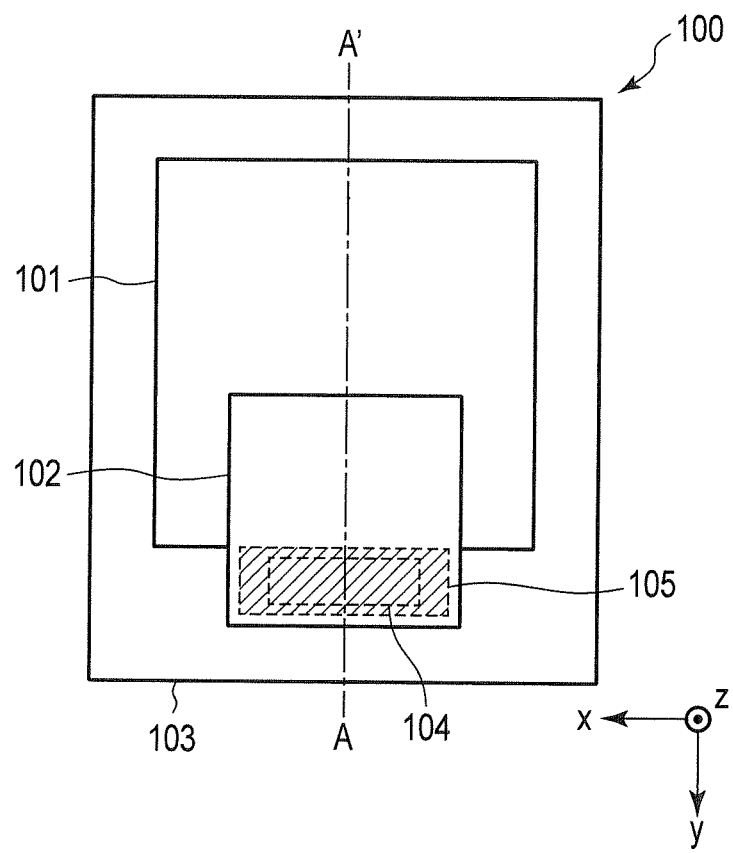
FIG. 1A is a view illustrating a semiconductor apparatus according to a first embodiment.
Figure 1B:
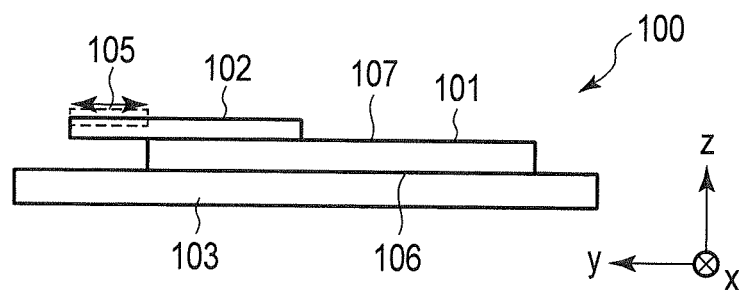
FIG. 1B is a sectional view illustrating the semiconductor apparatus according to the first embodiment.

A semiconductor apparatus according to a first embodiment will be described below with reference to FIG. 1A and FIG. 1B. FIG. 1A is a view of the semiconductor apparatus viewed from the z-axis direction, and FIG. 1B is a sectional view of the semiconductor apparatus cut along line A-A' in FIG. 1A, and viewed from the x-axis direction.

A semiconductor apparatus 100 according to the first embodiment includes a first semiconductor chip 101, a second semiconductor chip 102, a substrate 103, and a converter 104 (also called a first converter).

The first semiconductor chip 101 has a semiconductor substrate formed of a material such as silicon, silicon-germanium alloy, gallium arsenide or the like, and includes a metallic element formed inside the semiconductor substrate or in the surface layer of the semiconductor substrate by using a material such as copper, aluminum, gold or the like. The first semiconductor chip 101 is stacked on the substrate 103 in such a manner that a first surface 106 of the first semiconductor chip 101 is opposed to the substrate 103. It should be noted that the first semiconductor chip 101 may be formed of a dielectric substrate, magnetic substrate, metal or a combination of these. Further, the first semiconductor chip 101 may be formed of a chip size package (CSP). The second semiconductor chip 102 is, for example, a memory chip, and includes a semiconductor substrate similar to the first semiconductor chip 101. The second semiconductor chip 102 is stacked on a second surface 107 of the first semiconductor chip 101 opposed to first surface 106. The first semiconductor chip 101, and second semiconductor chip 102 are electrically connected to the wiring, ground, and the like of the substrate 103 through bonding wires or bumps.

The substrate 103 is a substrate on which the first semiconductor chip 101 is to be mounted. It should be noted that although not shown, components such as a chip capacitor, resistor, inductor, IC, and the like may be mounted on the substrate 103.

The converter 104 is at least one of an analog-to-digital converter, and digital-to-analog converter, and is arranged in a first area 105 of the second semiconductor chip 102. The first area 105 is located on the opposite surface of a surface of the second semiconductor chip 102 opposed to the second surface 107 of the first semiconductor chip 101. It should be noted that the arrangement of the converter 104 is not limited to the surface of the second semiconductor chip 102, and the converter 104 may be arranged under a dielectric layer or the like. Furthermore, the second semiconductor chip 102 is stacked on the first semiconductor chip 101 in such a manner that the first area 105 thereof does not overlap the first semiconductor chip 101 when viewed from the direction perpendicular to the second surface 107 of the first semiconductor chip 101. It should be noted that although it is desirable that the second semiconductor chip 102 be arranged in such a manner that the first area 105 thereof does not overlap the first semiconductor chip 101, the first area 105 may have an area overlapping the first semiconductor chip 101. The area of the second semiconductor chip 102 other than the first area 105 is an area in which, for example, an element configured to perform digital signal processing is included.

It should be noted that although the first semiconductor chip 101, second semiconductor chip 102, and substrate 103 each have a square shape in FIG. 1A and FIG. 1B, the shape is not limited to the square shape, and they may have a shape of a quadrilateral, polygon other than the quadrilateral, circle or some other complicated shape.

Here, temporarily a case where the second semiconductor chip 102 is stacked on the first semiconductor chip 101 in such a manner that the first area 105 thereof overlaps the first semiconductor chip 101 is assumed. In this case, the first semiconductor chip 101 is positioned immediately below the first area 105. Accordingly, the analog-to-digital converter or the digital-to-analog converter formed in the first area 105 is liable to be adversely affected by noise from the wiring or the ground formed in the first semiconductor chip 101 positioned immediately below the first area 105.

Further, even in the case where the wiring or the ground in the first semiconductor chip 101 is not positioned immediately below the first area 105, the analog-to-digital converter or the digital-to-analog converter present in the first area 105 is adversely affected by noise propagated through a substrate part of the first semiconductor chip 101.

Accordingly, as shown in this embodiment, by stacking the second semiconductor chip 102 on the first semiconductor chip 101 in such a manner that the first area 105 thereof does not overlap the first semiconductor chip 101, the analog-to-digital converter or the digital-to-analog converter formed in the first area 105 becomes impervious to being adversely affected by noise.

It should be noted that it is preferable that the area size of the first area 105 be smaller than half the area size of the second semiconductor chip 102, and the first area 105 be arranged in the part of the second semiconductor chip closer to an edge of the second semiconductor chip 102 than the center thereof. By fulfilling the above preference, an area in which the first semiconductor chip 101 and second semiconductor chip 102 overlap each other becomes greater, and the second semiconductor chip 102 can be fixed to the first semiconductor chip 101 with a greater area, and manufacture of the semiconductor apparatus is facilitated.

It should be noted that although in FIG. 1A and FIG. 1B the first area 105 has a rectangular shape, the shape is not limited to this, and the first area 105 may have an L-shape or some other shape.

According to the first embodiment described above, neither wiring, ground generating noise, nor part of the first semiconductor chip including a medium propagating noise are positioned immediately below the first area, and hence it is possible to make the analog-to-digital converter or the digital-to-analog converter impervious to being adversely affected by noise, and further, the manufacture of the semiconductor apparatus is facilitated.

Second Embodiment

A semiconductor apparatus 200 according to a second embodiment will be described below with reference to FIG. 2A, and FIG. 2B.

Figure 2A:
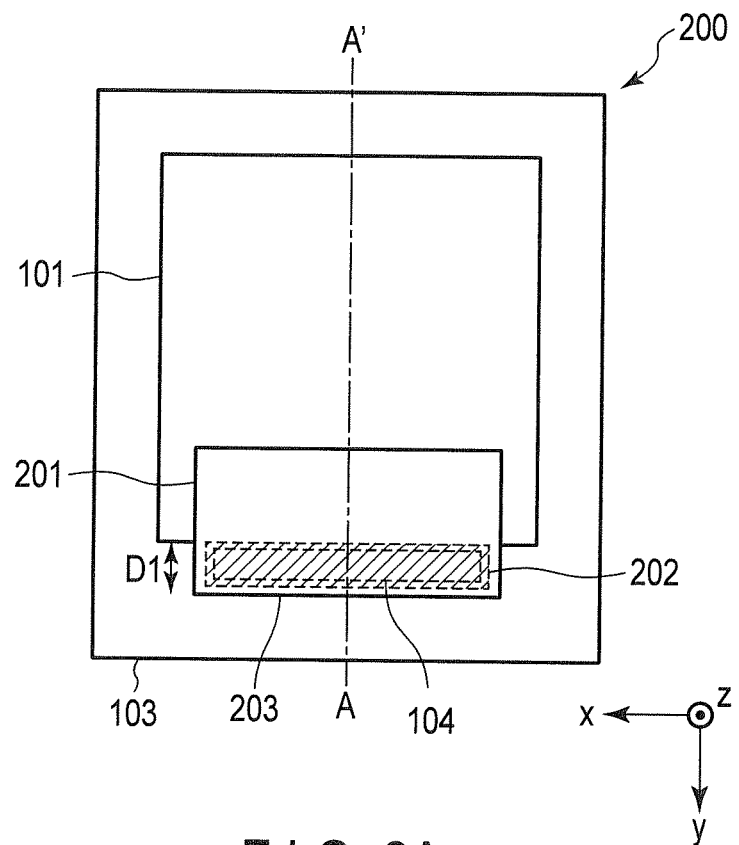
FIG. 2A is a view illustrating a semiconductor apparatus according to a second embodiment.
Figure 2B:
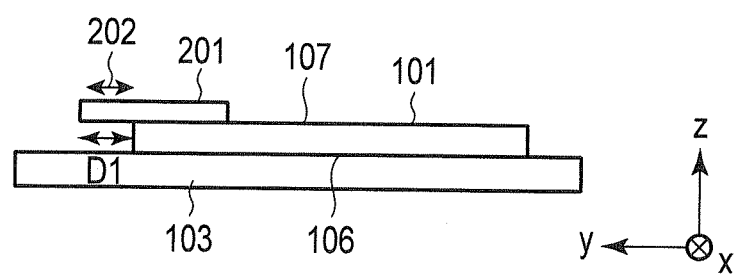
FIG. 2B is a sectional view illustrating the semiconductor apparatus according to the second embodiment.

FIG. 2A is a view of the semiconductor apparatus 200 viewed from the z-axis direction, and FIG. 2B is a sectional view of the semiconductor apparatus 200 cut along line A-A' in FIG. 2A, and viewed from the x-axis direction.

The semiconductor apparatus 200 according to the second embodiment includes a first semiconductor chip 101, a second semiconductor chip 201, a substrate 103, and a converter 104.

The first semiconductor chip 101, and substrate 103 are identical to the first embodiment, and hence a description thereof is omitted here. Although the second semiconductor chip 201 has a configuration substantially identical to the semiconductor chip 102 according to the first embodiment, the semiconductor chip 201 is different from the first embodiment in that the shape thereof is rectangular. As in the first embodiment, the second semiconductor chip 201 has a first area 202 including at least one of an analog-to-digital converter and a digital-to-analog converter. The shape of the first area 202 is rectangular. When viewed from the direction perpendicular to a second surface 107 of the first semiconductor chip 101, the first area 202 is positioned closer to the first long side 203 of the second semiconductor chip 201 than the center thereof, and is substantially parallel to the first long side 203.

The first long side 203 is the only one long side not overlapping the first semiconductor chip 101 of the sides of the second semiconductor chip 201 when they are viewed from the direction perpendicular to the second surface 107 of the first semiconductor chip 101.

Figure 3A:
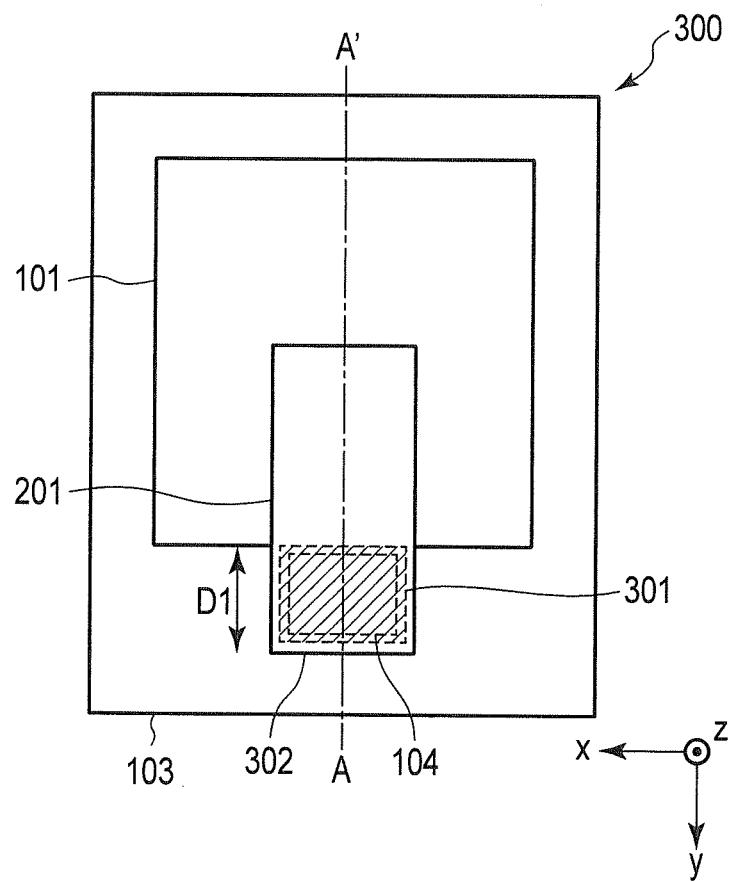
FIG. 3A is a view illustrating a case where a first area is formed at a position close to one short side of a second semiconductor chip.
Figure 3B:
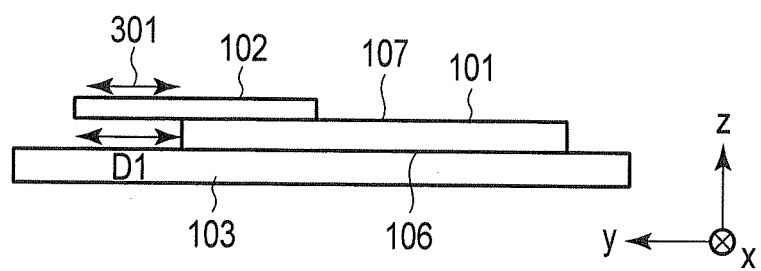
FIG. 3B is a sectional view illustrating the case where the first area is formed at a position close to the one short side of the second semiconductor chip.

Next, an example of a semiconductor apparatus in which a first area is formed at a position close to the short side of the second semiconductor chip 201 is shown in FIG. 3A and FIG. 3B. FIG. 3A is a view of the semiconductor apparatus 300 viewed from the z-axis direction, and FIG. 3B is a sectional view of the semiconductor apparatus 300 cut along line A-A' in FIG. 3A, and viewed from the x-axis direction. In the semiconductor apparatus 300 shown in FIG. 3A, and FIG. 3B, although the second semiconductor chip 201 is identical to the second semiconductor chip 201 shown in FIG. 2A, and FIG. 2B, the first area 301 is arranged closer to the first short side 302 than the center of the second semiconductor chip 201, and is substantially parallel to the first short side 302 when viewed from the stacking direction.

As shown in FIG. 3A, and FIG. 3B, when the first area 301 is arranged closer to the first short side 302, the distance D1 between one side of the first semiconductor chip 101 closest to the first area 301, and first short side 302 becomes greater than the distance D1 between the one side of the first semiconductor chip 101 closest to the first area 202, and first long side 203 shown in FIG. 2A, and FIG. 2B, and hence it becomes more difficult to fix the second semiconductor chip 201 to the first semiconductor chip 101.

According to the second embodiment described above, by making the second semiconductor chip rectangular, and arranging the first area closer to the long side of the second semiconductor chip not overlapping the first semiconductor chip among the sides of the second semiconductor chip when viewed from the direction perpendicular to the second surface 107 of the first semiconductor chip 101, the length of the part of the second semiconductor chip protruding from the first semiconductor chip from the side of the first semiconductor chip becomes shorter, and hence it becomes easier to fix the second semiconductor chip to the first semiconductor chip, the manufacture of the device is further facilitated, and the converter can be prevented from being adversely affected by noise.

It should be noted that in the second embodiment, although an example in which the second semiconductor chip 201 is rectangular is shown, the shape is not limited to the rectangle, and the second semiconductor chip 201 may have a shape of an ellipse, or some other polygon other than the regular polygon. In such a case, when a point at which the centerline (major axis in the case of an ellipse) of the second semiconductor chip 201 in the first direction and centerline (minor axis in the case of an ellipse) thereof in the second direction perpendicular to the first direction intersect each other is defined as the center of the second semiconductor chip, it is sufficient if the first area is positioned closer to the edge of the second semiconductor chip 201 in the first direction than the center thereof.

Third Embodiment

A semiconductor apparatus 400 according to a third embodiment will be described below with reference to FIG. 4A, and FIG. 4B.

Figure 4A:
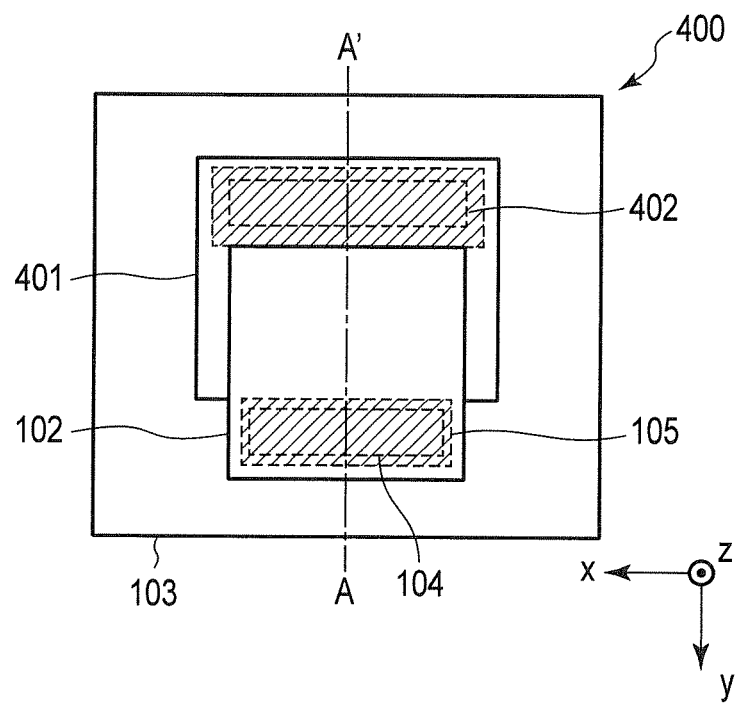
FIG. 4A is a view illustrating a semiconductor apparatus according to a third embodiment.
Figure 4B:
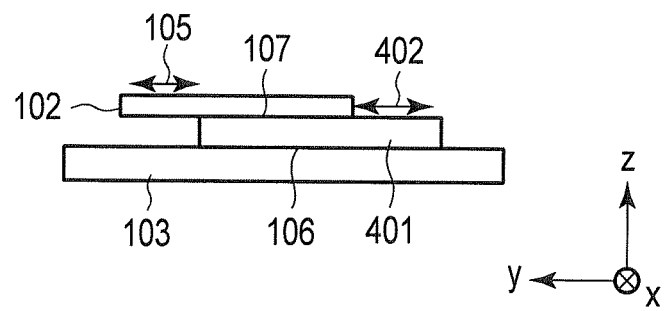
FIG. 4B is a sectional view illustrating the semiconductor apparatus according to the third embodiment.

FIG. 4A is a view of the semiconductor apparatus 400 viewed from the z-axis direction, and FIG. 4B is a sectional view of the semiconductor apparatus 400 cut along line A-A' in FIG. 4A, and viewed from the x-axis direction.

The semiconductor apparatus 400 according to the third embodiment includes a first semiconductor chip 401, a second semiconductor chip 102, a substrate 103, and a converter 104.

The second semiconductor chip 102, the substrate 103, and the converter 104 are identical to the second semiconductor chip 201, the substrate 103, and the converter 104 in the above-mentioned embodiment, and hence a description of them is omitted here.

The first semiconductor chip 401 is different from the above-mentioned first semiconductor chip 101 in that the chip 401 has a second area 402 including at least one (also called a second converter) of an analog-to-digital converter and a digital-to-analog converter.

The second area 402 is arranged at a position not overlapping the second semiconductor chip 102 when viewed from the direction perpendicular to a second surface 107 of the first semiconductor chip 401. That is, the second semiconductor chip 102 is stacked on the first semiconductor chip 401 in such a manner that the first area 105 and second area 402 do not overlap each other.

According to the third embodiment described above, the second semiconductor chip 102 is arranged on the first semiconductor chip 401 in such a manner that the first area does not overlap the first semiconductor chip, and the second area does not overlap the second semiconductor chip, and hence it is possible to reduce the adverse influence of noise from each of the semiconductor chips on each of the first area and second area.

Fourth Embodiment

A semiconductor apparatus 500 according to a fourth embodiment will be described below with reference to FIG. 5A, and FIG. 5B.

FIG. 5A is a view of the semiconductor apparatus 500 viewed from the z-axis direction, and FIG. 5B is a sectional view of the semiconductor apparatus 500 cut along line A-A' in FIG. 5A, and viewed from the x-axis direction.

The semiconductor apparatus 500 according to the fourth embodiment includes a first semiconductor chip 101, a second semiconductor chip 102, a substrate 103, converter 104, a third semiconductor chip 501, and bonding wires 502.

The first semiconductor chip 101, the second semiconductor chip 102, and the substrate 103 are identical to the first semiconductor chip 101, the second semiconductor chip 102, and the substrate 103 in the above-mentioned embodiment, and hence a description of them is omitted here.

The third semiconductor chip 501 is a semiconductor chip formed of the same manner as the first semiconductor chip 101 and second semiconductor chip 102, and has a function of an analog circuit such as an amplifier, mixer, or oscillator. It should be noted that the third semiconductor chip 501 may be formed of a dielectric substrate, magnetic substrate, metal or a combination of these, and may also be formed of a CSP. Further, although the shape of the third semiconductor chip 501 is a rectangle in FIG. 5A, and FIG. 5B, the shape is not limited to this, and the shape may be a quadrilateral, polygon, circle, or some other complicated shape.

It should be noted that although not shown, the third semiconductor chip 501 is electrically connected to the wiring or the ground of the substrate 103 through bonding wires or bumps. Further, the third semiconductor chip 501 may be electrically connected also to the first semiconductor chip 101.

The bonding wires 502 electrically connect the second semiconductor chip 102, and third semiconductor chip 501 to each other. The bonding wires 502 are formed of a conductor such as gold, copper, or aluminum.

As shown in FIG. 5A, and FIG. 5B, the second semiconductor chip 102 is stacked on the first semiconductor chip 101, and hence can be arranged with a smaller footprint than in the case where the first semiconductor chip 101, second semiconductor chip 102, and third semiconductor chip 501 are directly arranged on the substrate 103 without stacking one on top of the other. Such arrangement enables a smaller footprint, and hence it is possible to effectively utilize the limited space on the substrate. Further, the third semiconductor chip 501 does not overlap the first semiconductor chip 101, and hence it is possible to reduce the adverse influence of noise generated from the first semiconductor chip 101 on the analog circuit included in the third semiconductor chip 501.

Here, the second semiconductor chip 102, and third semiconductor chip 501 each may configure a wireless unit. The wireless unit mentioned here implies a transmitter, receiver or transceiver. According to the semiconductor apparatus 500 shown in FIG. 5A, and FIG. 5B, the analog-to-digital converter or the digital-to-analog converter included in the first area 105 of the second semiconductor chip 102 can compose a wireless unit impervious to being adversely affected by noise from the first semiconductor chip 101.

Next, a modification example of the fourth embodiment will be described below with reference to FIG. 6.

Figure 6:
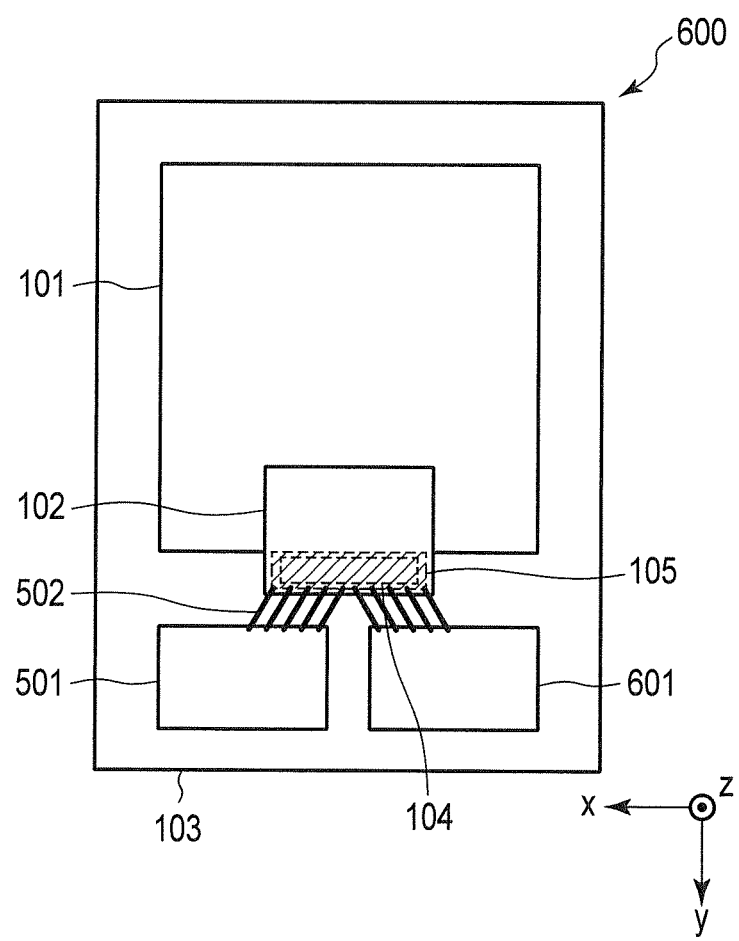
FIG. 6 is a view illustrating a semiconductor apparatus according to a modification example of the fourth embodiment.

A semiconductor apparatus 600 shown in FIG. 6 includes a fourth semiconductor chip 601 in addition to the semiconductor apparatus 500 shown in FIG. 5A, and FIG. 5B.

The semiconductor chip 601 is connected to the second semiconductor chip 102 by means of the bonding wires 502. Thereby, the third semiconductor chip 501, and fourth semiconductor chip 601 can share with each other at least one of the analog-to-digital converter and the digital-to-analog converter included in the first area 105 of the second semiconductor chip 102.

Each of the third semiconductor chip 501 and fourth semiconductor chip 601 operates as a high-frequency analog circuit of a separate wireless system, and can share with each other at least one of the analog-to-digital converter and the digital-to-analog converter included in the first area 105 of the second semiconductor chip 102, and hence it is possible to more effectively utilize the space on the substrate than in the case where an analog-to-digital converter or a digital-to-analog converter is additionally provided for the fourth semiconductor chip 601 on the substrate.

It should be noted that the second semiconductor chip 102 may also be connected to the third semiconductor chip 501 without using bonding wires. A connection example of the second semiconductor chip is shown in FIG. 7A, and FIG. 7B.

Figure 7A:
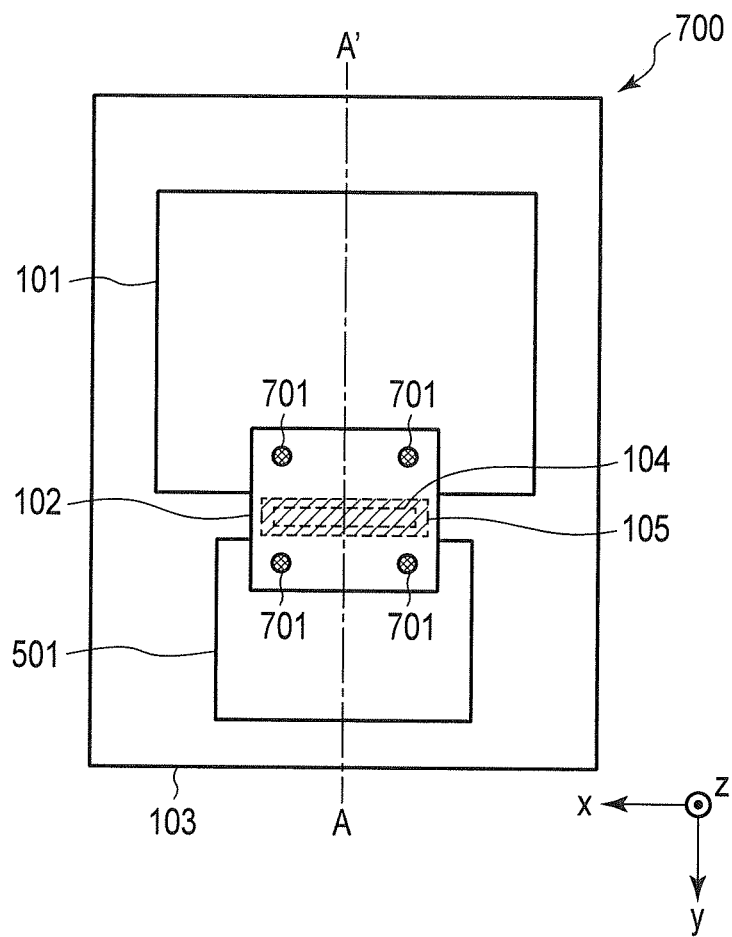
FIG. 7A is a view illustrating a connection example of a second semiconductor chip.
Figure 7B:
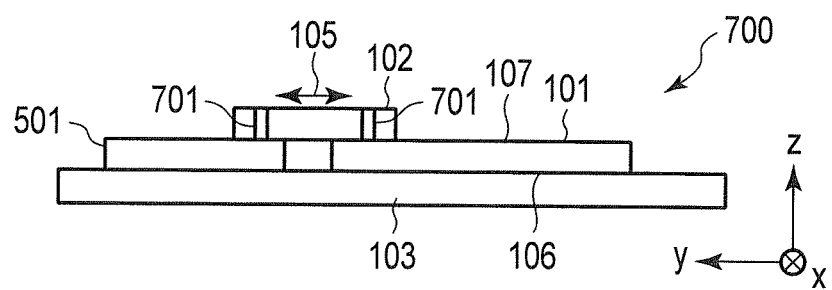
FIG. 7B is a sectional view illustrating the connection example of the second semiconductor chip.

In a semiconductor apparatus 700 shown in FIG. 7A, and FIG. 7B, the second semiconductor chip 102 is directly stacked on the third semiconductor chip 501. Furthermore, the wiring formed on the second semiconductor chip 102 is electrically connected to the wiring and ground formed on the third semiconductor chip 501 by using through-holes 701. Further, it is sufficient if stacking of the second semiconductor chip 102 is carried out in such a manner that the first area 105 of the second semiconductor chip 102 does not overlap the first semiconductor chip 101 and third semiconductor chip 501.

By directly stacking the second semiconductor chip on the third semiconductor chip as described above, it is possible to reduce the adverse influence of noise while enhancing the strength of the device to a higher degree than in the case where the second semiconductor chip is connected to the third semiconductor chip by using bonding wires.

According to the fourth embodiment described above, by providing the third semiconductor chip, it is possible to provide a wireless unit in which the adverse influence of noise from the first semiconductor chip is reduced, and by stacking the second semiconductor chip on the first semiconductor chip, it is possible to effectively utilize the space on the substrate. Furthermore, the third semiconductor chip is not stacked on the first semiconductor chip, and is arranged separate from the first semiconductor chip with a space held between them, and hence it is possible to reduce the adverse influence of noise from the analog circuit of the third semiconductor chip.

Fifth Embodiment

A semiconductor apparatus 800 according to a fifth embodiment will be described below with reference to FIG. 8A, and FIG. 8B.

Figure 8A:
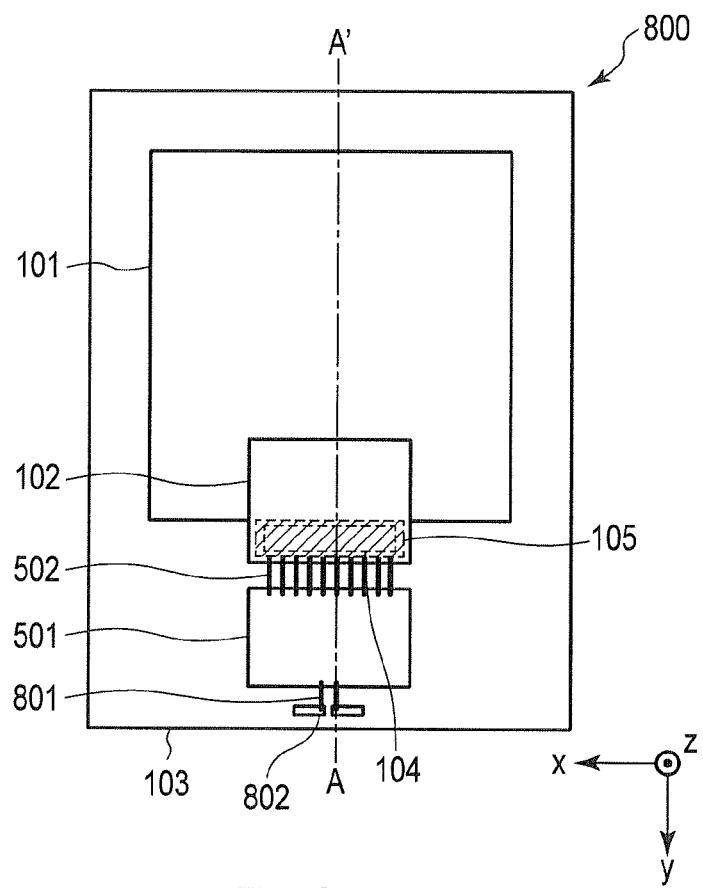
FIG. 8A is a view illustrating a semiconductor apparatus according to a fifth embodiment.
Figure 8B:
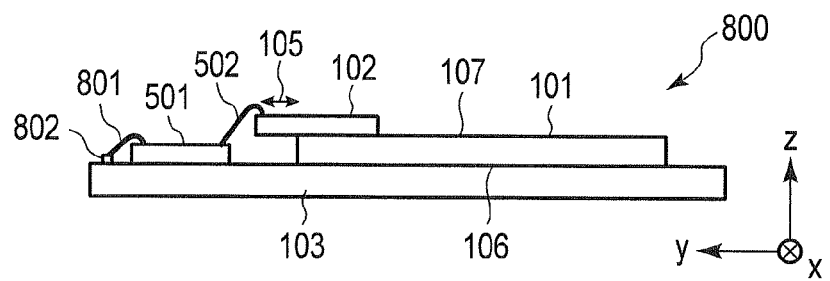
FIG. 8B is a sectional view illustrating the semiconductor apparatus according to the fifth embodiment.

FIG. 8A is a view of the semiconductor apparatus 800 viewed from the z-axis direction, and FIG. 8B is a sectional view of the semiconductor apparatus 800 cut along line A-A' in FIG. 8A, and viewed from the x-axis direction.

The semiconductor apparatus 800 according to the fifth embodiment includes a first semiconductor chip 101, a second semiconductor chip 102, a substrate 103, a converter 104, a third semiconductor chip 501, bonding wires 502, bonding wires 801, and an antenna 802. The first semiconductor chip 101, second semiconductor chip 102, substrate 103, third semiconductor chip 501, and bonding wires 502 are substantially identical to the semiconductor apparatus 500 shown in FIG. 5A, and FIG. 5B, and hence a description of them is omitted.

The bonding wires 801 electrically connect an analog circuit formed on the third semiconductor chip 501, and antenna 802 to each other.

In the example of FIG. 8A, and FIG. 8B, although the antenna 802 is a bilaterally symmetrical dipole antenna, the antenna is not limited to this, and may have an asymmetric shape. Further, the antenna may be an inverted F antenna, patch antenna, Yagi antenna, dielectric antenna or some other antenna. Furthermore, the number of antennas to be arranged is not limited to one, and may be plural. Further, although the antenna 802 is formed on the substrate 103, the antenna 802 may be formed on the third semiconductor chip 501, may be formed of the bonding wires 801 or may be a combination of these. Further, although the antenna 802 is connected to the third semiconductor chip 501 by using the bonding wires 801, the antenna 802 may be connected through bumps or the wiring of the substrate 103.

Next, a modification example of the semiconductor apparatus 800 according to the fifth embodiment will be described below with reference to FIG. 9.

Figure 9:
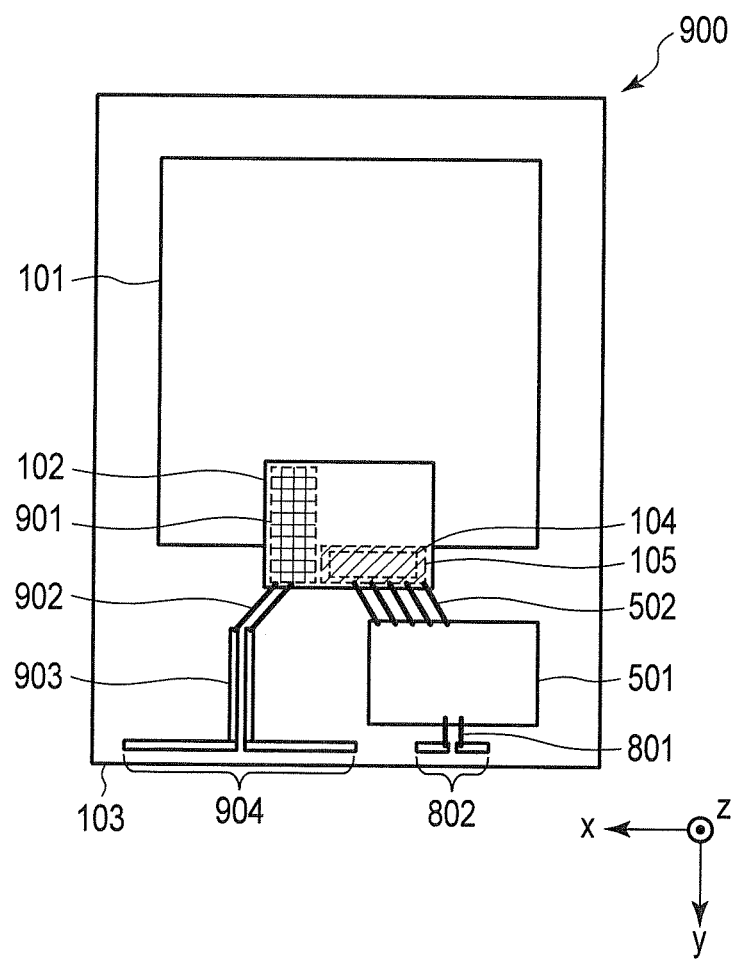
FIG. 9 is a view illustrating a semiconductor apparatus according to a modification example of the fifth embodiment.

A semiconductor apparatus 900 shown in FIG. 9 includes a high-frequency analog circuit 901, bonding wires 902, a wiring 903, and an antenna 904 in addition to the semiconductor apparatus 800 shown in FIG. 8A, and FIG. 8B. The high-frequency analog circuit 901 is an analog circuit of a second wireless system formed on the second semiconductor chip 102, and is different from the analog circuit of a first wireless system formed on the third semiconductor chip 501 in wireless system.

The bonding wires 902 electrically connect the high-frequency analog circuit 901, and wiring 903 to each other.

The wiring 903 is a metallic pattern arranged on the substrate.

The antenna 904 assumes a frequency band lower than the frequency band utilized by the antenna 802 for transmission/ reception. In FIG. 9, although the antenna 904 is a dipole antenna, the antenna may be other antennas described previously. Although the antenna 904 is formed on the substrate 103, the antenna 904 may partially or totally be formed of the bonding wires 902. Further, depending on the type of the antenna 904, the wiring 903 may not be included.

The frequency band utilized by the second wireless system is lower than the frequency band of the first wireless system utilized in the high-frequency analog circuit formed on the third semiconductor chip 501, and hence the transmission loss caused in the bonding wires 902 and wiring 903 is small. Accordingly, the transmission distance from the high-frequency analog circuit 901 to the antenna 904 can be made long.

According to the fifth embodiment described above, by connecting the antenna to the third semiconductor chip, at least one of the analog-to-digital converter and digital-to-analog converter formed on the second semiconductor chip can compose a wireless unit provided with an antenna, which is impervious to being adversely affected by noise from the first semiconductor chip.

Sixth Embodiment

A semiconductor apparatus 1000 according to a sixth embodiment will be described below with reference to FIG. 10A, and FIG. 10B.

Figure 10A:
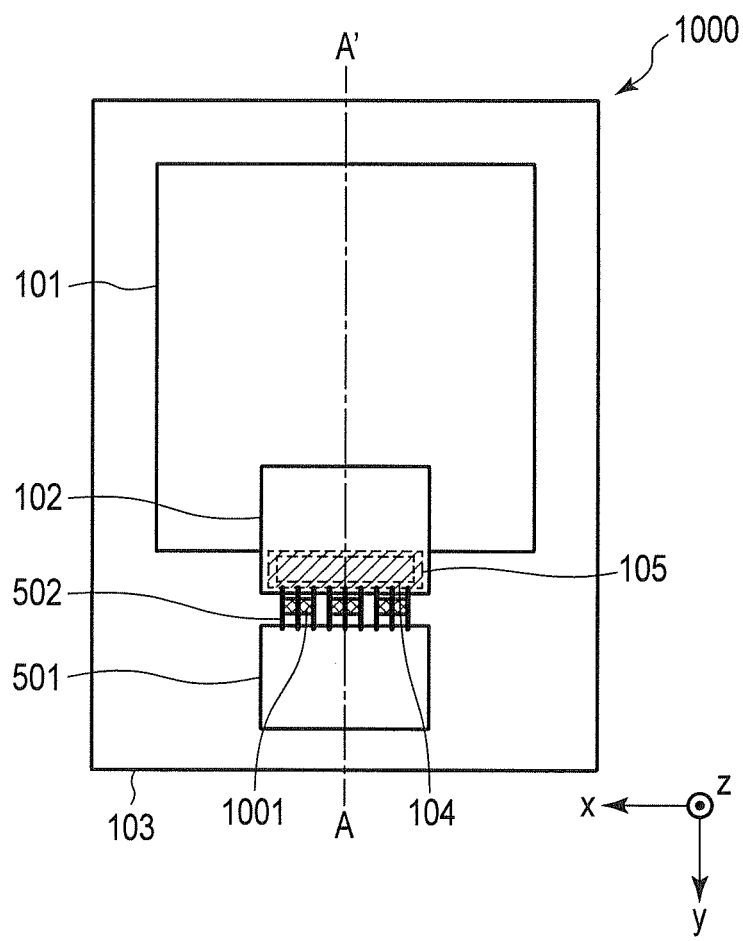
FIG. 10A is a view illustrating a semiconductor apparatus according to a sixth embodiment.
Figure 10B:
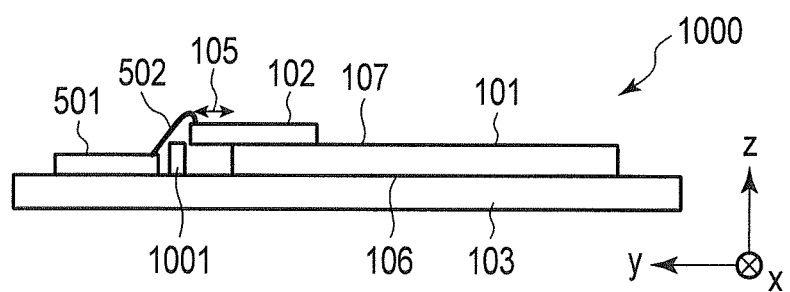
FIG. 10B is a sectional view of the semiconductor apparatus according to the sixth embodiment.

FIG. 10A is a view of the semiconductor apparatus 1000 viewed from the z-axis direction, and FIG. 10B is a sectional view of the semiconductor apparatus 1000 cut along line A-A' in FIG. 10A, and viewed from the x-axis direction.

The semiconductor apparatus 1000 according to the sixth embodiment includes a first semiconductor chip 101, a second semiconductor chip 102, a substrate 103, a converter 104, a third semiconductor chip 501, bonding wires 502, and components 1001.

The first semiconductor chip 101, the second semiconductor chip 102, the substrate 103, the converter 104, the third semiconductor chip 501, and bonding wires 502 are substantially identical to the semiconductor apparatus 500 shown in FIG. 5A, and FIG. 5B, and hence a description of them is omitted.

The components 1001 are elements other than the semiconductor chips to be mounted on the substrate 103, and are components such as an IC, resistor, capacitor, and the like. When viewed from the direction perpendicular to a second surface 107 of the first semiconductor chip 101, the components 1001 are arranged at positions on the substrate 103, and under the bonding wires 502, and are arranged between the first semiconductor chip 101, and third semiconductor chip 501 as shown in FIG. 10B. By arranging the components 1001 as described above, it is possible to effectively utilize the area on the substrate 103.

Figure 11A:
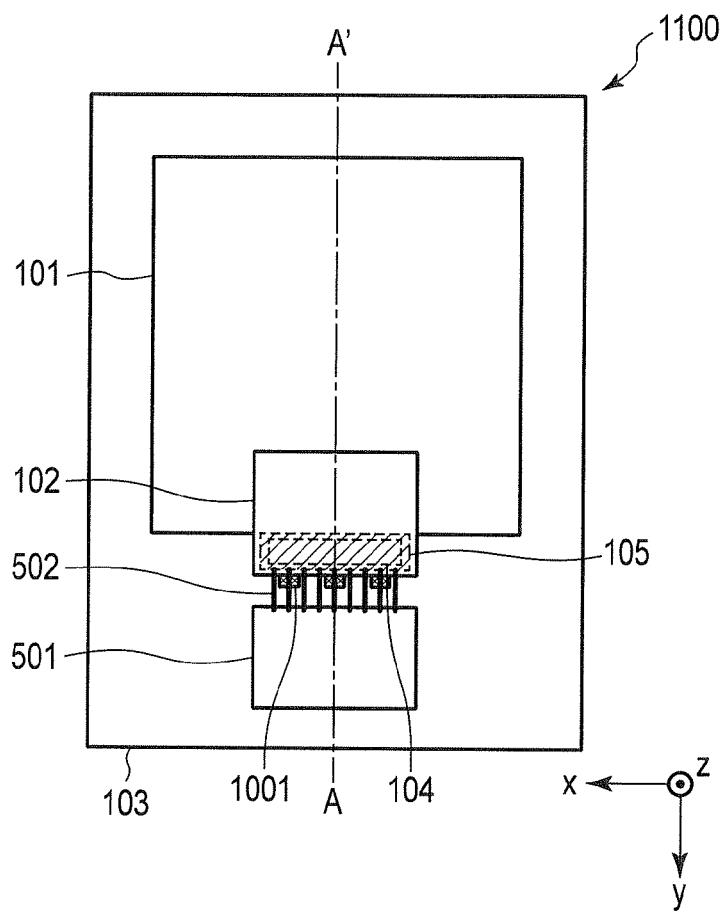
FIG. 11A is a view illustrating a semiconductor apparatus according to a modification example of the sixth embodiment.
Figure 11B:
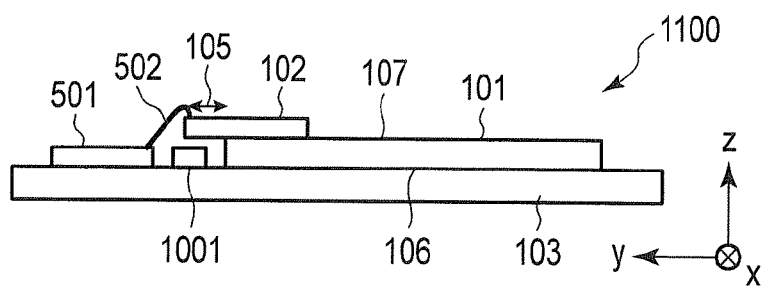
FIG. 11B is a sectional view of the semiconductor apparatus according to the modification example of the sixth embodiment.

Next, a modification example of the arrangement of the components 1001 is shown in FIG. 11A and FIG. 11B.

FIG. 11A is a view of a semiconductor apparatus 1100 viewed from the z-axis direction, and FIG. 11B is a sectional view of the semiconductor apparatus 1100 cut along line A-A' in FIG. 11A, and viewed from the x-axis direction.

Although the semiconductor apparatus 1100 has a configuration substantially identical to the semiconductor apparatus 1000 shown in FIG. 10A, and FIG. 10B, the device 1100 is different from the device 100 in the positions at which the components are arranged.

As shown in FIG. 11A and FIG. 11B, when viewed from the direction perpendicular to a second surface 107 of the first semiconductor chip 101, the components 1001 are arranged in such a manner that the components 1001 overlap the first area 105 of the second semiconductor chip 102. At this time, the components 1001 may be arranged in such a manner that part of each of the components 1001 overlaps (is covered with) the first area 105 or in such a manner that the components 1001 are totally covered with the first area 105.

As shown in FIG. 10A, FIG. 10B, FIG. 11A and FIG. 11B, the second semiconductor chip 102 has a height level-raised in the stacking direction by an amount corresponding the thickness of the first semiconductor chip 101, and hence the bonding wires 502 connected to the second semiconductor chip 102 are also level-raised by an amount corresponding to the thickness of the first semiconductor chip 101. Accordingly, the positions of the bonding wires 502 connecting the second semiconductor chip 102, and third semiconductor chip 501 to each other are also raised, and hence it becomes hard for the bonding wires 502 and components 1001 to interfere with each other.

According to the sixth embodiment described above, by arranging each component under at least one of each bonding-wire group, and the first area of the second semiconductor chip when viewed from the direction perpendicular to the second surface of the second semiconductor chip, it is possible to effectively utilize the area on the substrate.

Seventh Embodiment

A semiconductor apparatus 1200 according to a seventh embodiment will be described below with reference to FIG. 12A, and FIG. 12B. As the semiconductor apparatus 1200 shown in FIG. 12A, and FIG. 12B, an example of a ball grid array (BGA) package is shown.

FIG. 12A is a view of the semiconductor apparatus 1200 viewed from the z-axis direction, and FIG. 12B is a sectional view of the semiconductor apparatus 1200 cut along line A-A' in FIG. 12A, and viewed from the x-axis direction.

The semiconductor apparatus 1200 according to the seventh embodiment includes a first semiconductor chip 101, a second semiconductor chip 102, a substrate 103, a converter 104, a third semiconductor chip 501, bonding wires 502, bonding wires 801, an antenna 802, terminals 1201, and a sealing agent 1202.

The semiconductor apparatus 1200 has a configuration identical to the semiconductor apparatus 800 of FIG. 8A, and FIG. 8B except the terminals 1201, and sealing agent 1202.

The terminals 1201 are, for example, solder balls, and are conducting members formed for connection to other substrates, devices, and the like. A plurality of terminals 1201 are formed on an undersurface 1204 (also called a fourth surface) of the substrate 103 opposed to a top surface 1203 (also called a third surface) of the substrate 103 on which the first semiconductor chip 101 is mounted.

The sealing agent 1202 is formed of a thermosetting molding material obtained by adding, for example, a silica filler or the like to an epoxy resin used as a principal ingredient, and is molded and formed into a certain shape on the top surface 1203 of the substrate 103 for protection of the semiconductor chips.

Although a BGA package is assumed as the semiconductor apparatus 1200 shown in FIG. 12A, and FIG. 12B, the semiconductor apparatus 1200 may also be some other semiconductor package or a module sealed with the sealing agent. Further, although the terminals 1201 are solder balls, the terminals 1201 are not limited to the solder balls, and pads may be formed on the undersurface 1204 of the substrate 103.

According to the seventh embodiment described above, a plurality of terminals are formed on the undersurface of the substrate, whereby connection to the outside of the semiconductor apparatus is facilitated. Further, the top surface of the substrate is sealed with a sealing agent, whereby the semiconductor chips, bonding wires, and the like mounted on the top surface of the substrate can be protected from the external environment.

Eighth Embodiment

The semiconductor apparatus shown in FIG. 12A, and FIG. 12B can also be used as a wireless apparatus. An example of a wireless apparatus incorporating therein a semiconductor apparatus according to each of the fifth to seventh embodiments will be described below. The wireless apparatus is an apparatus in which the above-mentioned semiconductor apparatus is incorporated as a device configured to deliver/receive data, an image or an animation.

First, a wireless apparatus according to an eighth embodiment will be described below with reference to the block diagram of FIG. 13.

Figure 13:
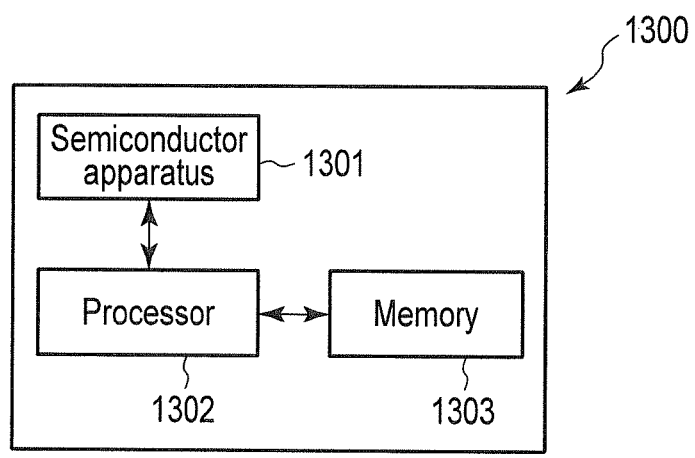
FIG. 13 is a block diagram illustrating a wireless apparatus incorporating therein a semiconductor apparatus according to an eighth embodiment.

The wireless apparatus 1300 shown in FIG. 13 includes a semiconductor apparatus 1301, a processor 1302, and a memory 1303.

The semiconductor apparatus 1301 performs data transmission/reception to/from the outside. It should be noted that any one of the semiconductor apparatuses of the fourth to seventh embodiments may be used.

The processor 1302 processes data received from the semiconductor apparatus 1301 or data to be transmitted to the semiconductor apparatus 1301.

The memory 1303 receives data from the processor 1302, and stores the received data therein.

Next, examples of wireless apparatuses each incorporating therein a semiconductor apparatus 1301 will be described below with reference to FIG. 14.

Here, the wireless apparatuses are, for example, a notebook PC 1401, and a mobile terminal 1402. Each of the notebook PC 1401 and mobile terminal 1402 includes a semiconductor apparatus 1301 internally or externally, and performs data communication by using a frequency of, for example, a millimeter waveband through the semiconductor apparatus 1301.

If the semiconductor apparatus 1301 incorporated in the notebook PC 1401, and the mobile terminal 1402 are arranged so that their directions, in which high antenna directivity is obtained, are opposed to each other, it is possible to efficiently perform data transmission/reception.

Figure 14:
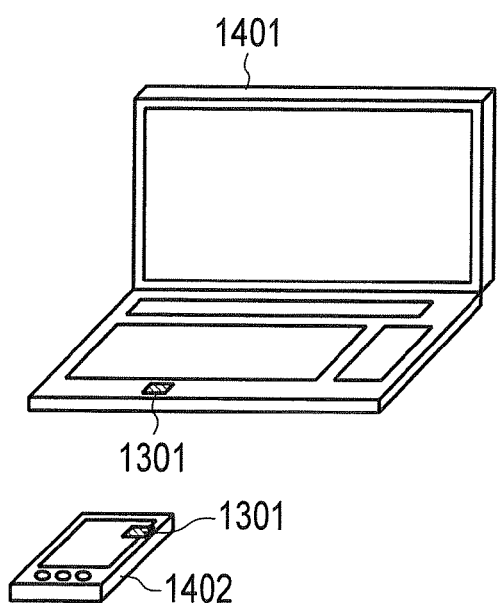
FIG. 14 is a view illustrating examples of wireless apparatuses each incorporating therein a semiconductor apparatus.

In the example of FIG. 14, although the notebook PC 1401 and mobile terminal 1402 are shown, the example is not limited to the above, and the semiconductor apparatus may be incorporated in an apparatus or device such as a TV, digital camera, memory card or the like.

According to the eighth embodiment described above, the above-mentioned semiconductor apparatuses are incorporated in the communication apparatuses configured to perform data communication, such as a notebook PC, and mobile terminal, and the like, whereby it is possible to efficiently perform data transmission/reception while reducing an adverse influence of noise.

Ninth Embodiment

Figure 15A:
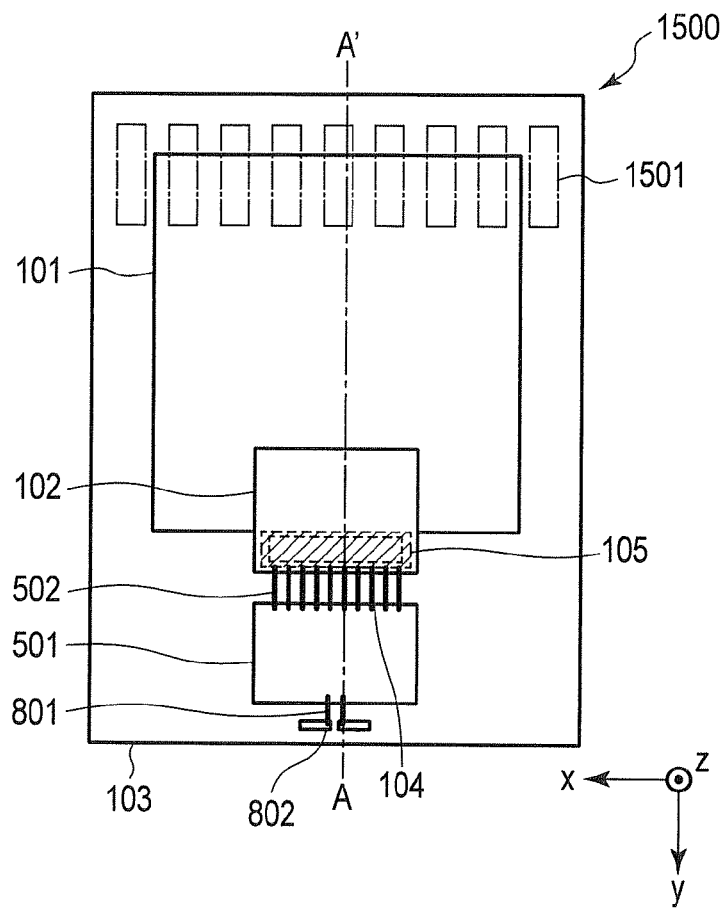
FIG. 15A is a view illustrating an example in which a semiconductor apparatus is incorporated in a memory card.
Figure 15B:
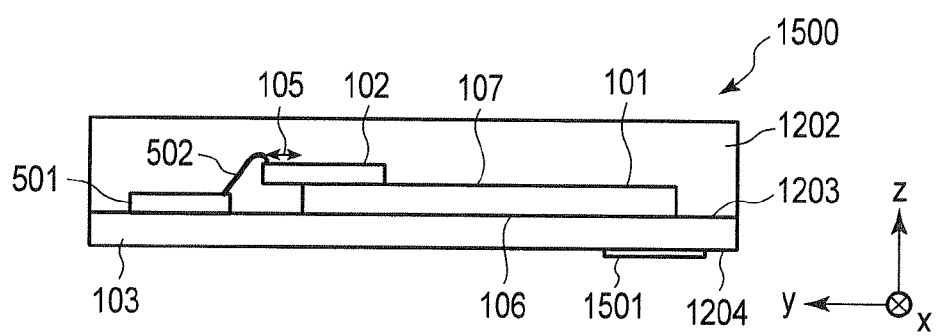
FIG. 15B is a sectional view illustrating the example in which the semiconductor apparatus is incorporated in the memory card.

An example of a wireless apparatus functioning as a memory card incorporating therein a semiconductor apparatus is shown in FIG. 15A, and FIG. 15B.

FIG. 15A is a view of a wireless apparatus 1500 viewed from the z-axis direction, and FIG. 15B is a sectional view of the wireless apparatus 1500 cut along line A-A' in FIG. 15A, and viewed from the x-axis direction. As the wireless apparatus 1500 shown in FIG. 15A, and FIG. 15B, a memory card is assumed. Although the wireless apparatus 1500 is substantially identical to the wireless apparatus shown in FIG. 12A, and FIG. 12B, the wireless apparatus 1500 is different from the wireless apparatus shown in FIG. 12A, and FIG. 12B in that the plurality of terminals 1201 formed on the undersurface 1204 of the substrate 103 are replaced with pads 1501 newly formed.

As a result, the wireless apparatus 1500 includes a semiconductor apparatus, whereby the wireless apparatus 1500 can perform wireless communication with a notebook PC, mobile terminal, digital camera, and the like.

According to the ninth embodiment described above, by incorporating a semiconductor apparatus in a wireless apparatus configured to perform wireless data communication with a notebook PC, mobile terminal or the like, the wireless apparatus functioning as a memory card, it is possible to provide a memory card impervious to being adversely affected by noise, and provided with a wireless communication function, and efficiently perform transmission/reception of data or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor apparatus, comprising:
a substrate;
a first semiconductor chip including a first surface and a second surface and being mounted on the substrate, the first surface being opposed to the substrate, the second surface being opposed to the first surface;
a second semiconductor chip including a first area and being stacked on the second surface; and
a first converter arranged in the first area, the first converter configured to perform at least one of analog-to-digital conversion and digital-to-analog conversion, wherein
a part of the first area does not overlap the first semiconductor chip when viewed from a direction perpendicular to the second surface.

2. The apparatus according to claim 1, wherein
the first area does not overlap the first semiconductor chip when viewed from the direction.

3. The apparatus according to claim 1, wherein
an area size of the first area is smaller than half an area size of the second semiconductor chip when viewed from the direction, the first area is positioned closer to an edge of the second semiconductor chip than a center of the second semiconductor chip.

4. The apparatus according to claim 1, wherein
a shape of the second semiconductor chip is a rectangle, the first area is arranged parallel to a first long side of the second semiconductor chip, and is positioned closer to the first long side than the center of the second semiconductor chip.

5. The apparatus according to claim 1, further comprising a second converter configured to perform at least one of analog-to-digital conversion and digital-to-analog conversion and arranged in a second area of the first semiconductor chip, the second area being different from the first area, wherein
the second area does not overlap the second semiconductor chip when viewed from the direction.

6. The apparatus according to claim 1, further comprising a third semiconductor chip including an analog circuit and mounted on the substrate, wherein
the second semiconductor chip and the third semiconductor chip are electrically connected to each other.

7. The apparatus according to claim 6, further comprising at least one antenna connected to the third semiconductor chip.

8. The apparatus according to claim 6, further comprising a component arranged between the first semiconductor chip and the third semiconductor chip.

9. The apparatus according to claim 1, wherein
the substrate includes a third surface opposed to the first surface of the first semiconductor chip and a fourth surface opposed to the third surface, the apparatus further comprising:
a plurality of terminals formed on the fourth surface; and
a sealing agent configured to seal the third surface.

* * * * *